United States Patent
MacMillan et al.

(10) Patent No.: US 9,219,122 B2
(45) Date of Patent: Dec. 22, 2015

(54) SILICON CARBIDE SEMICONDUCTOR DEVICES

(71) Applicant: Global Power Device Company, Lake Forest, CA (US)

(72) Inventors: Michael MacMillan, Rancho Santa Margarita, CA (US); Utpal K. Chakrabarti, Allentown, PA (US)

(73) Assignee: Global Power Technologies Group, Inc., Lake Forest, CA (US)

( * ) Notice: Subject to any disclaimer, the term of this patent is extended or adjusted under 35 U.S.C. 154(b) by 0 days.

(21) Appl. No.: 14/208,784

(22) Filed: Mar. 13, 2014

(65) Prior Publication Data

US 2014/0264382 A1   Sep. 18, 2014

Related U.S. Application Data

(60) Provisional application No. 61/780,615, filed on Mar. 13, 2013.

(51) Int. Cl.
| | |
|---|---|
| H01L 21/36 | (2006.01) |
| H01L 29/16 | (2006.01) |
| H01L 29/36 | (2006.01) |
| H01L 29/66 | (2006.01) |
| H01L 29/78 | (2006.01) |
| H01L 29/167 | (2006.01) |
| H01L 21/04 | (2006.01) |
| H01L 21/02 | (2006.01) |

(52) U.S. Cl.
CPC ...... *H01L 29/1608* (2013.01); *H01L 21/02236* (2013.01); *H01L 21/02255* (2013.01); *H01L 21/045* (2013.01); *H01L 21/049* (2013.01); *H01L 29/167* (2013.01); *H01L 29/36* (2013.01); *H01L 29/66068* (2013.01); *H01L 29/7802* (2013.01)

(58) Field of Classification Search
USPC ............................................................ 438/478
See application file for complete search history.

(56) References Cited

U.S. PATENT DOCUMENTS

| | | | |
|---|---|---|---|
| 8,841,682 B2 * | 9/2014 | Dhar et al. ................... | 257/77 |
| 2014/0284619 A1 * | 9/2014 | Nishio et al. ................ | 257/77 |

OTHER PUBLICATIONS

Atalla et al., Impurity Redistribution and Junction Formation in Silicon by Thermal Oxidation, Bell System Tech. J., 39:933-946, 1960.
Chou et al., Auger and ellipsometric study of phosphorus segregation in oxidized degenerate silicon, Appl. Phy. Lett., 24(4):200-202, 1974.

(Continued)

*Primary Examiner* — Jack Chen
(74) *Attorney, Agent, or Firm* — Perkins Coie LLP

(57) ABSTRACT

Methods, systems, and devices are disclosed for thermal processing of silicon carbide semiconductor devices. In one aspect, a method for fabricating a silicon carbide semiconductor device includes forming a thin epitaxial layer of a nitrogen and phosphorous co-doped SiC material on a SiC epitaxial layer formed on a SiC substrate, and thermally growing an oxide layer to form an insulator material on the nitrogen and phosphorous co-doped SiC epitaxial layer, in which the thermally growing the oxide layer results in at least partially consuming the nitrogen and phosphorous co-doped SiC epitaxial layer in the oxide layer to produce an interface including nitrogen and phosphorous between the SiC epitaxial layer and the oxide layer.

14 Claims, 4 Drawing Sheets

(56) References Cited

OTHER PUBLICATIONS

Cramer et al., Sodium passivation dependence on phosphorus concentration in tetraethylorthosilicate plasma-enhanced chemical vapor deposited phosphosilicate glasses, J. Applied Phys., 73(5):2458-2461, 1993.

Grove et al., Redistribution of Acceptor and Donor Impurities during Thermal Oxidation of Silicon, Jour. Appl. Phy., 35(9):2695-2701, 1964.

Liu et al., Enhanced Inversion Mobility on 4H-SiC (1120) Using Phosphorus and Nitrogen Interface Passivation, IEEE Electron Device Letters, 34(2):181-183, 2013.

Radtke et al., Initial stages of SiC oxidation investigated by ion scattering and angle-resolved x-ray photoelectron spectroscopies, Appl. Phy. Lett., 78(23):3601-3603, 2001.

Xia, et al., High Aspect Ratio Trench Filling Using Two-Step Subatmospheric Chemical Vapor Deposited Borophosphosilicate Glass for <0.18 um Device Application, J. Electrochem. Soc., 146(5):1884-1888, 1999.

\* cited by examiner

SILICON CARBIDE SEMICONDUCTOR DEVICES

CROSS REFERENCE TO RELATED APPLICATIONS

This patent document claims the benefit of U.S. Provisional Patent Application No. 61/780,615, filed on Mar. 13, 2013, entitled "SILICON CARBIDE SEMICONDUCTOR DEVICES." The entire content of the before-mentioned patent application is incorporated by reference as part of the disclosure of this document.

TECHNICAL FIELD

This patent document relates to semiconductor technologies.

BACKGROUND

Silicon carbide (SiC) semiconductor materials can exist in various crystalline forms and can be used to construct a range of SiC based circuits and devices. In comparison with the commonly used silicon, SiC materials possess properties such as a wide bandgap structure and higher breakdown field. These properties make SiC materials attractive for a wide range of circuits and applications including high power electronics.

A field-effect transistor (FET) is a transistor that uses an electric field to control the shape and in turn the conductivity of a channel of one type of charge carrier in a semiconductor material. FETs are unipolar transistors that involve single-carrier-type operation. FETs can be structured to include an active channel through which majority charge carriers, e.g., such as electrons or holes, flow from a source to a drain. The main terminals of a FET include a source, through which the majority carriers enter the channel; a drain, through which the majority carriers leave the channel; and a gate, the terminal that modulates the channel conductivity. For example, source and drain terminal conductors can be connected to the semiconductor through ohmic contacts. The channel conductivity is a function of the potential applied across the gate and source terminals.

SUMMARY

Techniques, systems, and devices are described for thermal processing of the $SiO_2$—SiC interface in fabrication of SiC integrated circuit (IC) chips.

In one aspect, a method for fabricating a silicon carbide semiconductor device includes forming a thin epitaxial layer of a nitrogen and phosphorous co-doped SiC material on a SiC epitaxial layer formed on a SiC substrate, and thermally growing an oxide layer to form an insulator material on the nitrogen and phosphorous co-doped SiC epitaxial layer, in which the thermally growing the oxide layer results in at least partially consuming the nitrogen and phosphorous co-doped SiC epitaxial layer in the oxide layer to produce an interface including nitrogen and phosphorous between the SiC epitaxial layer and the oxide layer.

In another aspect, a method is provided for fabricating a SiC semiconductor device and includes forming a thin epitaxial layer of a nitrogen and phosphorous co-doped SiC material on a SiC epitaxial layer formed on a SiC substrate; thermally growing an oxide layer to form an insulator material on the nitrogen and phosphorous co-doped SiC epitaxial layer; and providing a boron compound during the thermally growing of the oxide layer. In this method, the thermally growing the oxide layer results in at least partially consuming the nitrogen and phosphorous co-doped SiC epitaxial layer and the boron compound in the oxide layer to produce an interface including nitrogen, phosphorous, and boron between the SiC epitaxial layer and the oxide layer.

In yet another aspect, a SiC device is provided to include a SiC substrate; a SiC epitaxial layer formed on the SiC substrate; an oxide layer of an insulator material formed on the SiC epitaxial layer, the oxide layer including a surface layer including at least one of nitrogen, phosphorous, or boron to form an interface with the SiC epitaxial layer; and one or more transistor structures over the oxide layer.

The above and other aspects of the disclosed technology and their implementations are described in greater detail in the drawings, the description and the claims.

DETAILED DESCRIPTION

Techniques, systems, and devices are described for thermal processing of the $SiO_2$—SiC interface in fabrication of SiC integrated circuit (IC) chips.

Silicon carbide can be used as a semiconductor material for fabricating power electronic devices, e.g., such as field effect transistors used in power control applications, including high power circuits. Fabrication of such field effect transistors can include creating an insulator on a silicon carbide (SiC) substrate. For example, in the case of a silicon dioxide ($SiO_2$) insulator material on the SiC substrate, a disturbed interface exists between the $SiO_2$ and the SiC due to the changed surface stoichiometry, which can result in a surface roughness that have negative effects on the performance of the device. For example, a layer of $SiO_2$ insulator material can be grown on the SiC material at high temperature (e.g., within a range 900° C. to 1200° C.) in an oxidizing environment, e.g., including, but not limited to, dry oxygen, wet oxygen, steam, nitrous oxide ($N_2O$), nitric oxide (NO), among other oxygenated environments. For example, such a process of creating an insulator like $SiO_2$ can often lead to a complex interface and a non-stoichiometric surface of SiC, e.g., which can result in low carrier mobility at the $SiO_2$/SiC interface.

For fabricating metal oxide field effect transistors (MOSFET), an epitaxial layer is grown on a SiC substrate. For example, the thickness and doping concentration of the epitaxial layer can be designed to meet performance requirements of a final MOSFET device. Furthermore, an $SiO_2$ layer can be grown on the epitaxial layer to act as an insulating layer.

Figure 1:
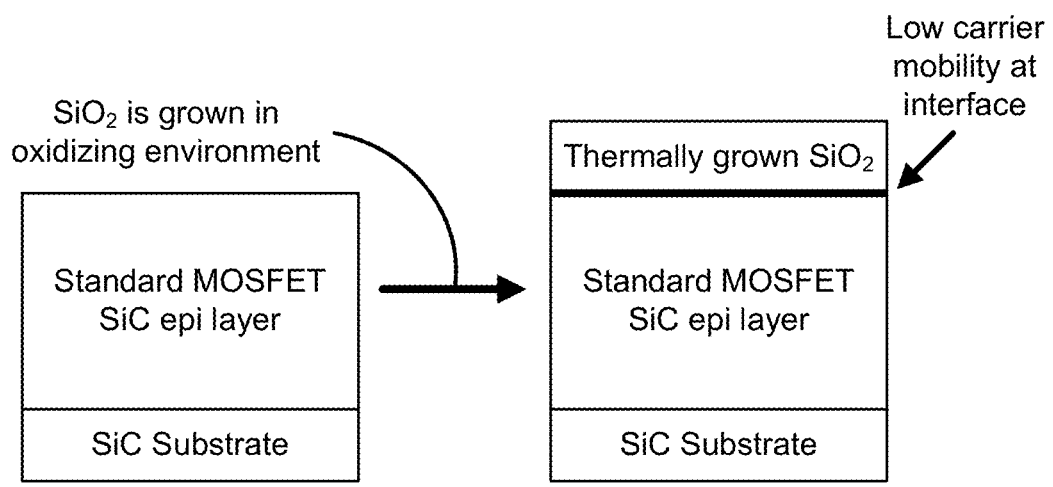
FIG. 1 shows a processing diagram of a device including a silicon dioxide layer grown on a silicon carbide device.

FIG. 1 shows an example of a processing diagram of a device including a $SiO_2$ layer grown on the exemplary SiC epitaxial layer on a SiC substrate. For example, the layer of $SiO_2$ (the exemplary insulator layer) can be grown on the SiC at high temperatures (e.g., typical range 900° C. to 1200° C.) in an oxidizing environment. Common examples include dry oxygen, wet oxygen, steam, $N_2O$, NO, etc. Such processes for creating an insulator layer like SiO2 can often lead to a complex interface and non-stoichiometric surface of SiC. As shown in FIG. 1, the interface between the $SiO_2$ layer and the SiC epitaxial layer forms a disturbed layer (e.g., having a non-stoichiometry and increased roughness). The performance of an exemplary field effect transistor can be sensitive to and this is affected by the quality of the $SiO_2$/SiC interface.

In implementations, a disturbed/rough interface formed between the SiC and a silicon oxide/insulator layer can give rise to a number of undesired results, including, for example, (1) spatial variations that randomly change from one location to another on the interface, which can change electrical properties (e.g., carrier mobility or electrical resistance) from one location to another and create random variations from one device (e.g., such as a FET) to another device formed on the substrate; and (2) increase the resistance and thus decrease carrier mobility in the device. This can significantly degrade the device performance.

Figure 2:
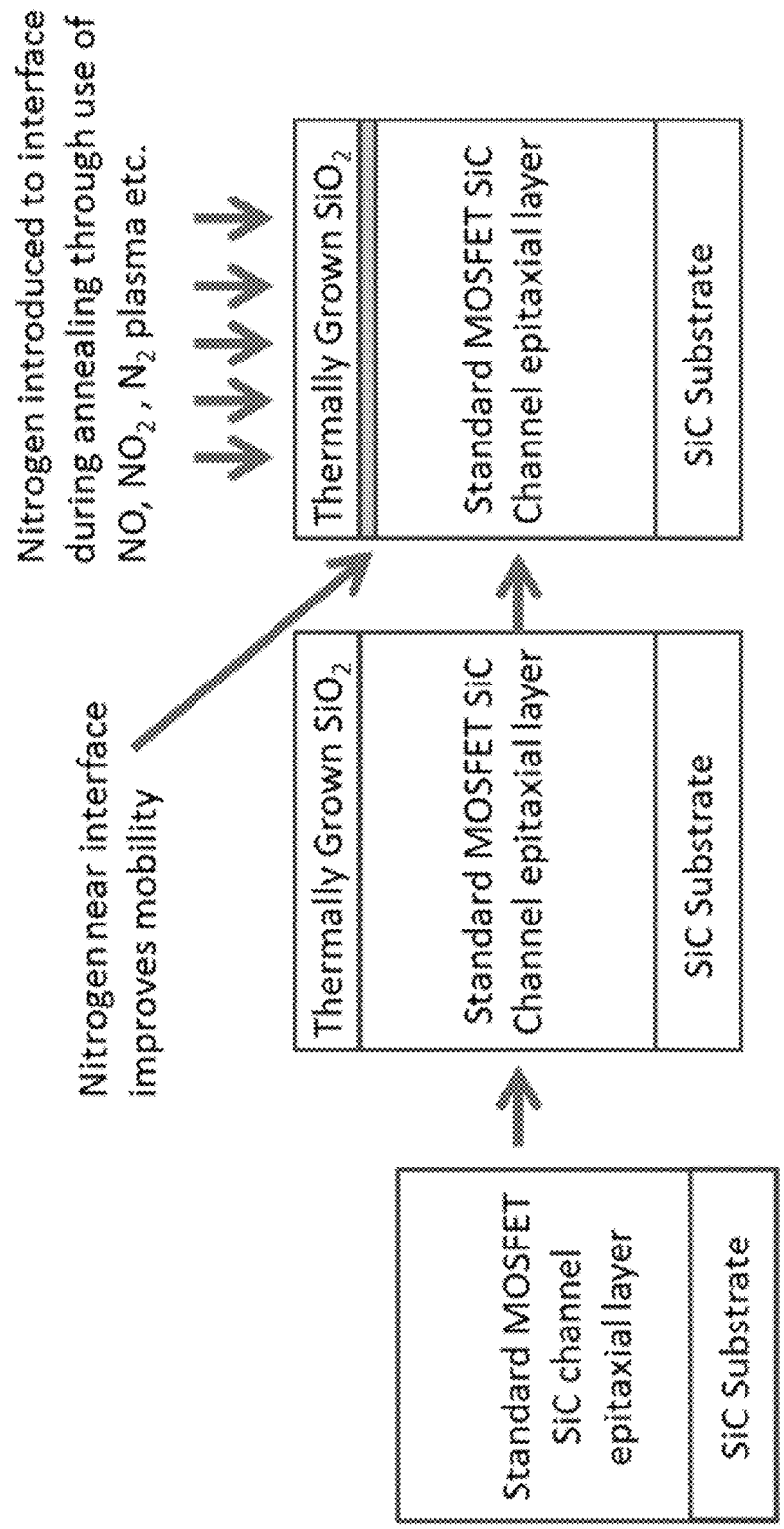
FIG. 2 shows a processing diagram of a device in which nitrogen is introduced at the interface between silicon carbide and a silicon dioxide insulator layer.

FIG. 2 shows an example of a processing diagram of a metal oxide semiconductor field effect transistor (MOSFET) device including a thermally grown $SiO_2$ insulator layer on a SiC epitaxy layer/SiC substrate in which nitrogen is introduced (e.g., by annealing in a nitrogen environment) to interface between the silicon carbide epitaxial layer and outer silicon dioxide insulator layer. For example, annealing the MOSFET device in a $N_2$, NO or $N_2O$ environment can passivate the interface defect and thus improve the quality of the $SiO_2$/SiC interface.

Incorporation of phosphorous at or near the $SiO_2$—SiC interface can also passivate electronic interface defects and improve MOSFET performance. For example, this incorporation of phosphorous helps create an additional amorphous glassy phase at the $SiO_2$—SiC interface, e.g., which can be referred to as Phosphosilicate Glass (PSG). However, processing techniques can be difficult to implement, as the concentration of phosphorus needs to be carefully controlled to obtain the improved performance of the MOSFET. For example, the presence of excess phosphorus often lead to other deleterious effects like moisture sensitivity. Additionally, incorporation of nitrogen with or without phosphorous can be introduced at the $SiO_2$—SiC interface to passivate the electronic interface defects and improve MOSFET performance. However, conventional processing techniques to introduce nitrogen and/or phosphorous include several multiple high temperature steps, increasing the likelihood of deleterious effects.

Techniques, systems, and devices are disclosed for incorporating nitrogen and/or phosphorous at or near an $SiO_2$—SiC interface in SiC-based IC devices in a single thermal processing step.

Also disclosed are techniques, systems, and devices for further incorporating boron-doped PSG (e.g., also referred to as BPSG) at or near a $SiO_2$—SiC interface in SiC-based IC devices in a single thermal processing step. The use of BPSG at or near the $SiO_2$—SiC interface, can improve the fabrication of SiC-based IC devices. For example, by incorporating boron-doped PSG at or near the $SiO_2$—SiC interface, the level of phosphorous in PSG can be reduced while retaining the passivation effects and improving mobile ion gettering.

In some implementations, the disclosed techniques include using BPSG as a viscous glass at the growth temperature and creating a smooth interface with SiC. For example, smooth interface advantageously reduces surface flaws on the SiC surface.

In one aspect, a method for fabricating a silicon carbide semiconductor device includes forming a thin epitaxial layer of a nitrogen and phosphorous co-doped SiC material on a SiC epitaxial layer formed on a SiC substrate, and thermally growing an oxide layer to form an insulator material on the nitrogen and phosphorous co-doped SiC epitaxial layer, in which the thermally growing the oxide layer results in at least partially consuming the nitrogen and phosphorous co-doped SiC epitaxial layer in the oxide layer to produce an interface including nitrogen and phosphorous between the SiC epitaxial layer and the oxide layer.

Figure 3:
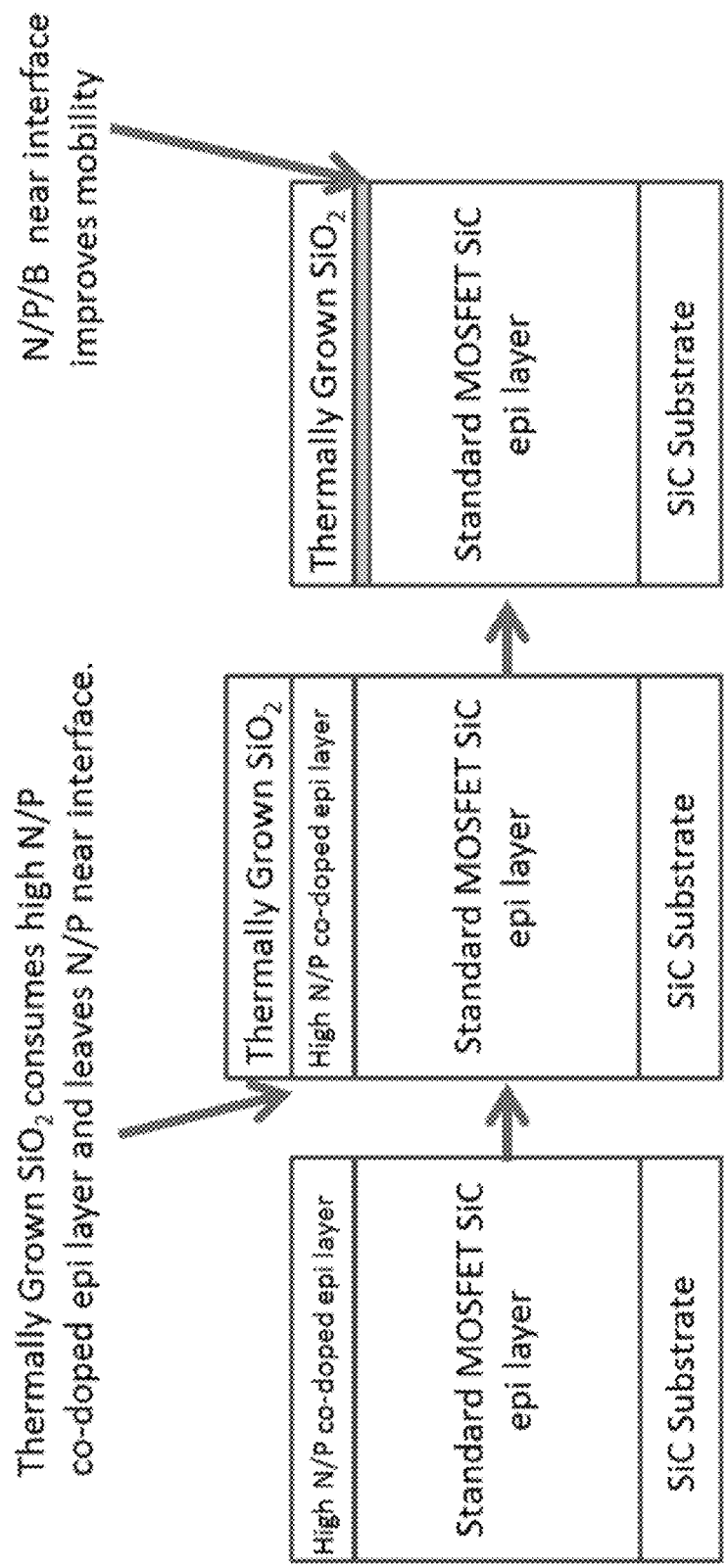
FIG. 3 shows a processing diagram of a method to fabricate a silicon carbide semiconductor device.

In some implementations of the method, the insulator material can include silicon oxide. In one example of the fabrication method, a thin SiC epitaxial layer (e.g., 100 Å-5000 Å) doped with high concentration of nitrogen and phosphorous ($>1\times10^{18}$ cm$^{-3}$) can be grown on top of a channel epitaxial SiC layer. In a subsequent fabrication step, for example, an oxidation process can be carried out to produce a $SiO_2$ layer, and in the process, the heavily doped SiC layer (high N/P co-doped SiC epitaxy layer) is consumed such that the nitrogen and phosphorous constituents are incorporated at the $SiO_2$—SiC interface, as shown in FIG. 3. For example, the oxide layer can be grown at a high temperature within a range 900° C. to 1200° C. in an oxidizing environment. For example, the nitrogen and phosphorous co-doped SiC epitaxial layer can be formed to have a thickness less than 500 nm. For example, the nitrogen and phosphorous co-doped SiC material can be configured to have a carrier concentration in a range from 0 to greater than $1\times10^{18}$ cm$^{-3}$ for each element. In some implementations, the method can further include forming one or more transistor structures over the insulator material.

In another aspect, a method for fabricating a silicon carbide semiconductor device includes forming a thin epitaxial layer of a nitrogen and phosphorous co-doped SiC material on a SiC epitaxial layer formed on a SiC substrate, thermally growing an oxide layer to form an insulator material on the nitrogen and phosphorous co-doped SiC epitaxial layer, and providing a boron compound during the thermally growing of the oxide layer, in which the thermally growing the oxide layer results in at least partially consuming the nitrogen and phosphorous co-doped SiC epitaxial layer and the boron compound in the oxide layer to produce an interface including nitrogen, phosphorous, and boron between the SiC epitaxial layer and the oxide layer.

In some implementations, for example, the boron can be introduced in the oxide layer by incorporating boron compounds in the oxidizing ambient. For example, the incorporation of boron incorporation can include a concentration in a range from 0 to greater than $1\times10^{18}$ cm$^{-3}$. In some implementations, the method can further include forming one or more transistor structures over the insulator material.

The exemplary method provides a convenient technique to create BPSG by using incorporated sources of boron in the ambient environment during thermal oxidation of SiC. Some examples sources of boron include, but are not limited to, $H_3BO_4$, $B_2O_3$, $B_2H_6$, as well as other organo-metalic boron compounds (e.g., such as tri-methly borate, tri-etheyl borate, among others). For example, the concentration of boron source in the oxidizing ambient can be controlled to obtain the desired concentration of boron in the exemplary BPSG layer.

Figure 4:
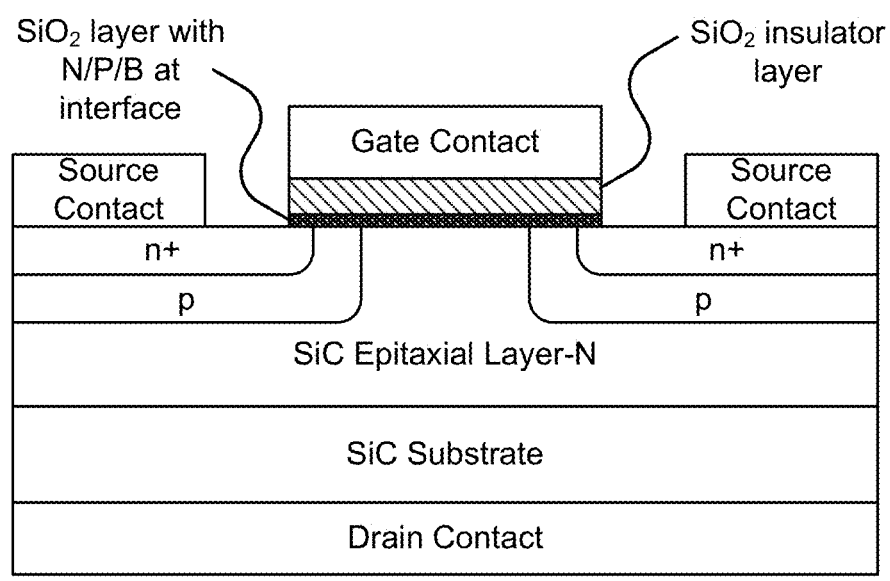
FIG. 4 shows a schematic of an exemplary silicon carbide metal insulator semiconductor field effect transistor device.

Implementations of the fabrication method can produce FET devices with improved performance of structures. FIG. 4 shows a schematic of an exemplary silicon carbide metal insulator semiconductor field effect transistor (MISFET) device that includes an interface including nitrogen, phosphorous, and/or boron between the $SiO_2$ insulator layer and the SiC Epitaxial layer over a SiC substrate.

The device in FIG. 4 can include a base structure including a SiC substrate configured between a drain contact (e.g., drain electrode) and a SiC epitaxial layer-N. A region of the SiC epitaxial layer-N can be configured to provide a contact surface at the top of the base structure that interfaces with the exemplary insulator layer, e.g., such as silicon dioxide. The insulator layer is formed of an oxide layer on the SiC epitaxial layer-N, in which the exemplary insulator layer includes an interfacial surface that includes nitrogen, phosphorous, and/or boron. The interfacial surface including nitrogen, phosphorous, and/or boron is formed from a thin epitaxial layer of a nitrogen, phosphorous, and/or boron co-doped SiC material initially formed on the SiC epitaxial layer that is at least partially consumed into the insulator layer during formation (e.g., thermal growth) of the oxide layer. The SiC MISFET device can include a gate contact configured above the insulator layer. The SiC MISFET device can include an n+ layer formed on a p-type well region formed on the SiC epitaxial layer-N. The SiC MISFET device can include source contacts that interface with the n+ layer of the SiC MISFET device.

In some examples of the device, the SiC device can include a SiC substrate, a SiC epitaxial layer formed on the SiC substrate, an oxide layer of an insulator material formed on the SiC epitaxial layer, in which the oxide layer includes a surface layer including nitrogen, phosphorous, and/or boron that forms an interface with the SiC epitaxial layer, and one or more transistor structures over the oxide layer.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A method for fabricating a silicon carbide (SiC) semiconductor device, comprising:
   forming a thin epitaxial layer of a nitrogen and phosphorous co-doped SiC material on a SiC epitaxial layer formed on a SiC substrate, the nitrogen and phosphorous co-doped SiC epitaxial layer having a first thickness; and
   thermally growing an oxide layer to form an insulator material on the nitrogen and phosphorous co-doped SiC epitaxial layer to at least partially consume the nitrogen and phosphorous co-doped SiC epitaxial layer in the oxide layer to produce an interface including nitrogen and phosphorous between the SiC epitaxial layer and the oxide layer, wherein the at least partially consuming of the nitrogen and phosphorous co-doped SiC epitaxial layer causes the nitrogen and phosphorous co-doped SiC epitaxial layer to have a second thickness smaller than the first thickness.

2. The method as in claim 1, wherein the insulator material includes silicon oxide.

3. The method as in claim 1, wherein the oxide layer is grown at a high temperature within a range from 900° C. to 1200° C. in an oxidizing environment.

4. The method as in claim 1, wherein the nitrogen and phosphorous co-doped SiC epitaxial layer has a thickness less than 500 nm.

5. The method as in claim 1, wherein the nitrogen and phosphorous co-doped SiC material has a carrier concentration greater than $1 \times 10^{18}$ cm$^{-3}$ for either or both the nitrogen and the phosphorous.

6. The method as in claim 1, further comprising forming one or more transistor structures over the insulator material of the oxide layer.

7. The method as in claim 1, wherein the thermally growing of the oxide layer includes forming the oxide layer and the interface including nitrogen and phosphorous between the SiC epitaxial layer and the oxide layer in a single step.

8. A method for fabricating a SiC semiconductor device, comprising:
   forming a thin epitaxial layer of a nitrogen and phosphorous co-doped SiC material on a SiC epitaxial layer formed on a SiC substrate, the nitrogen and phosphorous co-doped SiC epitaxial layer having a first thickness;
   thermally growing an oxide layer to form an insulator material on the nitrogen and phosphorous co-doped SiC epitaxial layer; and
   providing a boron compound during the thermally growing of the oxide layer,
   wherein the thermally growing the oxide layer results in at least partially consuming the nitrogen and phosphorous co-doped SiC epitaxial layer and the boron compound in the oxide layer to produce an interface including nitrogen, phosphorous, and boron between the SiC epitaxial layer and the oxide layer, and wherein after the thermally growing of the oxide layer, the nitrogen and phosphorous co-doped SiC epitaxial layer has a second thickness smaller than the first thickness.

9. The method as in claim 8, wherein the insulator material includes silicon oxide.

10. The method as in claim 8, wherein the oxide layer is grown at a high temperature within a range from 900° C. to 1200° C. in an oxidizing environment.

11. The method as in claim 8, wherein the nitrogen and phosphorous co-doped SiC epitaxial layer has a thickness less than 500 nm.

12. The method as in claim 8, wherein the boron compound includes one or more of $H_3BO_4$, $B_2O_3$, $B_2H_6$, or organometalic boron compounds including tri-methly borate or tri-etheyl borate.

13. The method as in claim 8, further comprising forming one or more transistor structures over the insulator material of the oxide layer.

14. The method as in claim 8, wherein the thermally growing of the oxide layer includes forming the oxide layer and the interface including nitrogen, phosphorous, and boron between the SiC epitaxial layer and the oxide layer in a single step.

* * * * *